(12) United States Patent
Chang et al.

(10) Patent No.: US 7,394,126 B2
(45) Date of Patent: Jul. 1, 2008

(54) NON-VOLATILE MEMORY AND MANUFACTURING METHOD THEREOF

(75) Inventors: Ko-Hsing Chang, Hsinchu (TW); Su-Yuan Chang, Hsinchu Hsien (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 11/308,717

(22) Filed: Apr. 26, 2006

(65) Prior Publication Data
US 2007/0170493 A1    Jul. 26, 2007

(30) Foreign Application Priority Data
Jan. 20, 2006   (TW)  ............... 95102238 A

(51) Int. Cl.
*H01L 29/788* (2006.01)
*H01L 21/336* (2006.01)
(52) U.S. Cl. ............... 257/316; 257/321; 438/259
(58) Field of Classification Search ............ 438/257, 438/259, 266, 267; 257/316, 321, 322, 330, 257/E29.129, E29.13, E29.131
See application file for complete search history.

(56) References Cited

U.S. PATENT DOCUMENTS

| | | | |
|---|---|---|---|
| 6,800,526 B2 * | 10/2004 | Lin et al. | 438/267 |
| 6,815,758 B1 * | 11/2004 | Chang et al. | 257/315 |
| 6,821,849 B2 | 11/2004 | Chang et al. | 438/266 |
| 6,894,339 B2 | 5/2005 | Fan et al. | 257/314 |
| 7,129,536 B2 * | 10/2006 | Chen et al. | 257/316 |
| 2004/0183124 A1 | 9/2004 | Hsu et al. | 257/316 |

OTHER PUBLICATIONS

Article titled "Vertical floating-gate 4.5F$^2$ Split-gate NOR Flash Memory at 110nm Node" authored by Lee et al. in Jan. 6, 2004, *IEEE*.

* cited by examiner

*Primary Examiner*—Mark Prenty
(74) *Attorney, Agent, or Firm*—Jianq Chyun IP Office

(57) ABSTRACT

A non-volatile memory is described, including a substrate, a floating gate, a control gate, a source region, and a drain region. A trench is disposed in the substrate, and a step-like recess is located in the substrate beside the trench. The floating gate is disposed on the sidewall of the trench. The control gate is disposed on the substrate between the trench and the step-like recess which extends in the step-like recess. The source region is disposed in the substrate at the bottom of the trench. The drain region is disposed in the substrate at the bottom of the step-like recess.

19 Claims, 3 Drawing Sheets

NON-VOLATILE MEMORY AND MANUFACTURING METHOD THEREOF

CROSS-REFERENCE TO RELATED APPLICATION

This application claims the priority benefit of Taiwan application serial no. 95102238, filed on Jan. 20, 2006. All disclosure of the Taiwan application is incorporated herein by reference.

BACKGROUND OF THE INVENTION

1. Field of Invention

The present invention relates to a memory and manufacturing method thereof. More particularly, the present invention relates to a non-volatile memory and manufacturing method thereof.

2. Description of Related Art

In various non-volatile memory products, as the electrically erasable programmable read-only memory (EEPROM) can perform multiple times of operations of programming, reading, erasing, etc. and has the advantage that the saved data will not be lost after the power is off, it has been a memory unit widely applied in personal computer (PC) and electronic devices.

The typical EEPROM includes a floating gate and a control gate made of doped polysilicon. In order to avoid the data error due to the seriously excessive erasing/writing when the typical EEPROM performs erasing/writing operation, a select transistor is connected in serial at one side of the control gate and the floating gate so as to form a two-transistor (2T) structure. The select transistor can control the programming and reading of the memory.

Referring to U.S. patent application No. US 2004/0183124 A1, the patent application provides a flash memory cell, wherein a select gate is disposed in the substrate so as to reduce the device size of the flash memory cell and improve the device integration.

Although the memory can reduce the width size of the memory, the channel length of the memory may be shortened accordingly. Therefore, when operating the non-volatile memory with 2T structure, the leakage current may cause program disturbance etc. in different bias voltage, so that the memory is written wrongly.

The above problem may reduce the reliability of the memory and cause poor efficiency of the product. It can be learned that by increasing the channel length and reducing the leakage current while keeping the device integration is an immediate problem to be resolved.

SUMMARY OF THE INVENTION

Accordingly, the present invention is directed to provide a non-volatile memory and manufacturing method thereof, which can increase the channel length of the memory and avoid the leakage current.

Another aspect of the present invention is to provide a non-volatile memory and manufacturing method thereof, using self-alignment to form the floating gate and the control gate so that the manufacturing cost and time can be saved.

The present invention provides a non-volatile memory, including a substrate, a floating gate, a control gate, a source region, and a drain region. A trench is disposed in the substrate, and a step-like recess is located in the substrate beside the trench. The floating gate is disposed on the sidewall of the trench. The control gate is disposed on the substrate between the trench and the step-like recess which extends in the step-like recess. The source region is disposed in the substrate at the bottom of the trench. The drain region is disposed in the substrate at the bottom of the step-like recess.

In the aforementioned non-volatile memory, the top of the floating gate is higher than the top surface of the substrate.

The non-volatile memory further includes a tunneling dielectric layer which is disposed between the floating gate and the substrate.

The non-volatile memory further includes a floating gate dielectric layer which is disposed on the surface of the floating gate. The material of the floating gate dielectric layer includes silicon oxide-silicon nitride-silicon oxide.

The non-volatile memory further includes a control gate dielectric layer which is disposed between the control gate and the floating gate, and disposed between the control gate and the substrate.

The non-volatile memory further includes a source conductive layer which is disposed on the source region to fill the trench. A protection layer is further disposed on the source conductive layer.

In the non-volatile memory, the channel region is step-like disposed under the control gate.

The non-volatile memory further includes a bit line which is electrically connected to the drain region.

In the non-volatile memory, the material of the control gate includes doped polysilicon.

As the control gate is disposed on the substrate between the trench and the step-like recess which is extending in the step-like recess, the channel region under the control gate is a step-like channel region. The channel length of the step-like channel region is longer as to avoid the leakage current, meanwhile, the program disturbance can be avoided when the memory is performing programming and erasing operation and the reliability of the memory is further improved.

The present invention provides a manufacturing method of a non-volatile memory, which includes: for example, first, a substrate is provided, and a mask layer is formed on the substrate; next, a trench is formed in the substrate and the mask layer, and a tunneling dielectric layer is then formed in the trench; next, a floating gate is formed on the sidewall of the trench, and a floating gate dielectric layer is formed on the floating gate; next, a source region is formed in the substrate under the trench; next, part of the mask layer is removed and a first spacer is formed on the substrate at the outside of the trench; later on, the substrate not covered by the first spacer is etched so as to form the step-like recess in the substrate beside the trench; afterward, the first spacer is removed, and a control gate dielectric layer is formed on the substrate; next, a control gate is formed on the substrate which is extending in the step-like recess from the outside of the trench; then, a drain region is formed in the substrate at the bottom of the step-like recess.

According to the manufacturing method of the non-volatile memory, wherein the formation method of the control gate includes, for example, first, a conductive layer is formed on the substrate; next, part of the conductive layer is removed so as to form the control gate and expose part of the substrate at the bottom of the step-like recess.

According to the manufacturing method of the non-volatile memory, wherein the formation method of the floating gate includes: for example, a conductive layer is formed on the substrate, and the top surface of the conductive layer is higher than the top surface of the substrate; next, a second spacer is formed on the two sidewalls of the trench on the conductive layer; after that, part of the conductive layer is removed using the second spacer as the mask, and a floating gate is formed on the two sidewalls of the trench, and part of the substrate at the bottom of the trench is exposed; then, the second spacer is removed.

According to the manufacturing method of the non-volatile memory, wherein the formation method of the first spacer includes: for example, the mask layer is removed and a first spacer material layer is formed on the substrate; next, part of the first spacer material layer is removed, and the first spacer is formed on the sidewall of the floating gate.

The manufacturing method of the non-volatile memory further includes forming a source conductive layer in the trench after the step of forming the floating gate dielectric layer. And, a protection layer is formed on the source conductive layer after the step of forming the source conductive layer.

According to the manufacturing method of the non-volatile memory, the material of the floating gate dielectric layer includes silicon oxide-silicon nitride-silicon oxide. Wherein the material of the control gate includes doped polysilicon.

The manufacturing method of the non-volatile memory further includes forming a bit line electrically connected to the drain region after the process of forming the drain region.

According to the manufacturing method of the non-volatile memory, as the step-like recess is formed in the substrate, the bottom of the control gate is disposed on the substrate and extending in the step-like recess is step-like. That is, the channel region under the control gate is a step-like channel region. Since the length of the step-like channel region is longer, the leakage current can be avoided, so that the memory unit would not disturb the adjacent memory unit when performing the programming operation, and further the reliability of the memory can be improved.

In order to make the aforementioned and other objects, features and advantages of the present invention obviously comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
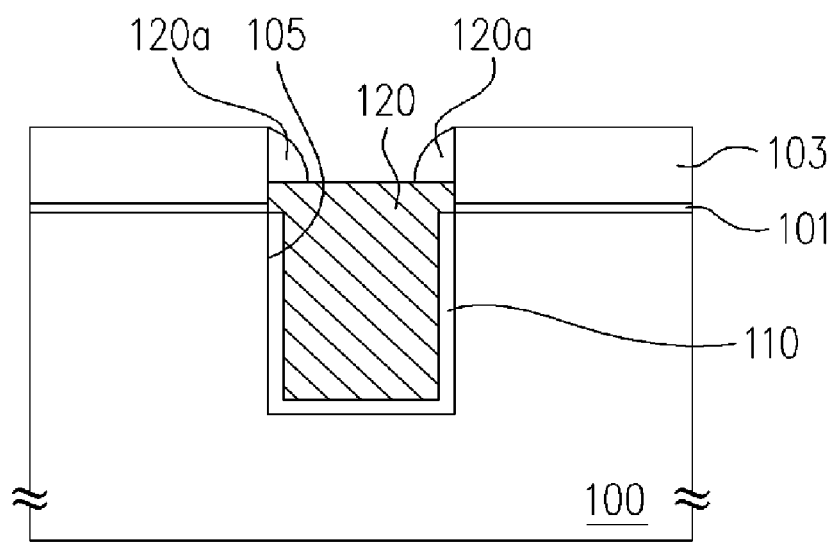
FIG. 1A-FIG. 1E are cross-sectional block diagrams of the manufacturing process of the non-volatile memory according to the embodiment of the present invention.

FIG. 1A-FIG. 1E are cross-sectional schematic diagrams of the manufacturing process of the non-volatile memory according to the embodiment of the present invention. Referring to FIG. 1A, the method includes: first, a substrate 100 is provided, and the substrate 100 is, for example, a silicon substrate; next, a pad layer 101 and a mask layer 103 are formed on the substrate 100, wherein the material of the pad layer 101 is, for example, silicon oxide which the formation method thereof is, for example, thermal oxidation, and the material of the mask layer 103 is, for example, silicon nitride, silicon carbide, or silicon oxycarbide (SiOC) which the formation method is, for example, chemical vapor deposition.

Next, referring to FIG. 1A, a trench 105 is formed in the substrate 100, the pad layer 101 and the mask layer 103. The formation method of the trench 105 includes, for example, first, the mask layer 103 and the pad layer 101 are patterned, and part of the substrate 100 is removed so as to form the trench 105 using the patterned mask layer 103 as the mask. Wherein, the method of patterning the mask layer 103 and the pad layer 101 includes, for example, first, a patterned photoresist layer (not shown) is formed, and the exposed mask layer 103 and pad layer 101 are removed using the patterned photoresist layer as the mask. The method of removing part of the mask layer 103 and the pad layer 101 includes, for example, a reactive ion etching method. The method of removing part of the substrate 100 includes, for example, a dry etching method.

Next, referring to FIG. 1A, a tunneling dielectric layer 110 is formed in the trench 105. The material of the tunneling dielectric layer 110 is, for example, silicon oxide, and the formation method thereof includes, for example, thermal oxidation or chemical vapor deposition. Next, a conductive layer 120 is formed in the trench 105, and the top surface of the conductive layer 120 is higher than the top surface of the substrate 100. The material of the conductive layer 120 is, for example, doped polysilicon which the formation method includes: for example, first, a conformal conductive material layer (not shown) is formed on the substrate 100; next, the conductive material layer on the mask layer 103 and part of the conductive material layer on the top of the trench 105 are removed. Then, a spacer 120a is formed on the two sidewalls of the trench 105 above the conductive layer 120, and the material is, for example, silicon oxide. The formation method of the spacer 120a includes, for example, a spacer material layer (not shown) is formed on the substrate 100 using the chemical vapor deposition; next, the spacer material layer is performed by a dry etching process so as to form a couple of spacers 120a on the two sidewalls of the trench 105.

Figure 1B:
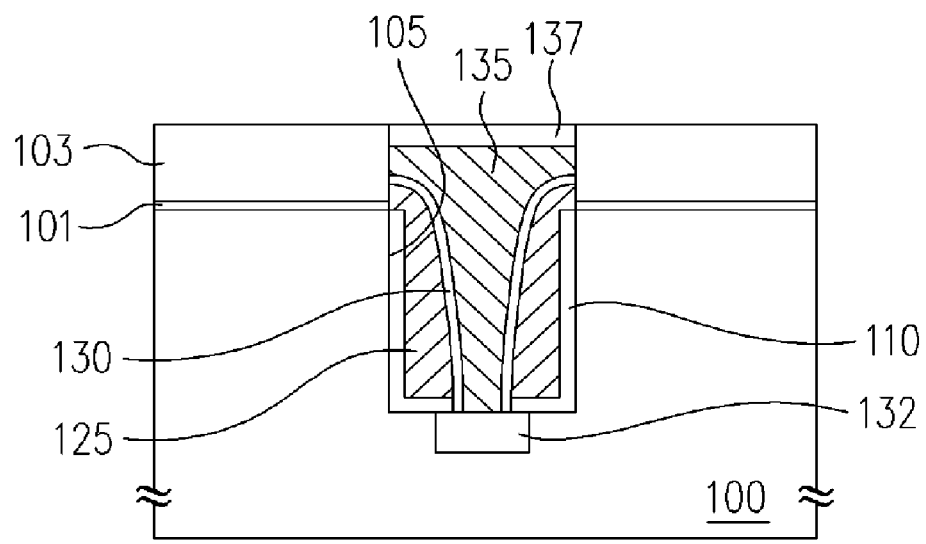

Next, referring to FIG. 1B, part of the conductive layer 120 is removed, and a floating gate 125 is formed on the sidewall of the trench 105 and part of the substrate 100 at the bottom of the trench 105 is exposed. The method of removing part of the conductive layer 120 includes, for example, performing a reactive ion etching method using the spacer 120a as the mask. The formed floating gate 125 is, for example, as block and disposed on the two opposite sidewalls of the trench 105. Next, the spacer 120a is removed, and the removing method is, for example, a wet etching method. Thereafter, a floating gate dielectric layer 130 is formed on the floating gate 125. The floating gate dielectric layer 130 is, for example, an silicon oxide layer, a silicon nitride layer, a silicon oxynitride layer or a compound dielectric layer of silicon oxide-silicon nitride or silicon oxide-silicon nitride-silicon oxide. The formation method of the floating gate dielectric layer 130 includes, for example, a thermal oxidation method or a chemical vapor deposition method using different reaction gas depending on the material of the floating gate dielectric layer 130.

Next, referring to FIG. 1B, a source region 132 is formed in the substrate 100 under the trench 105. The source region 132 is, for example, a P type doped region or an N type doped region. For example, the source region 132 is formed by performing impurity implanting using the floating gate 125 as the mask. Next, a source conductive layer 135 is formed in the trench 105, and the top surface of the source conductive layer 135 is higher than the top surface of the floating gate 125. The material of the source conductive layer 135 is, for example, doped polysilicon, which the formation method includes, for example, performing an ion implanting process after an undoped polysilicon layer is formed using chemical vapor deposition, or using in-situ impurity implanting method to form the doped polysilicon by using chemical vapor deposition. Of course, the material of the source conductive layer 135 can also be conductive material such as metal, metal silicide, etc., and the formation method of the source conductive layer 135 includes physical vapor deposition or chemical vapor deposition. Certainly, if the bottom of the trench 105 is covered by the previously formed floating gate dielectric layer 130, the floating gate dielectric layer 130 on the bottom of the trench 105 needs to be removed before the aforementioned source conductive layer 135 is formed. Thereafter, a protection layer 137 is formed on the source conductive layer 135. The material of the protection layer 137 is, for example, silicon oxide, and the formation method of the protection layer 137 includes, for example, thermal oxidation or chemical vapor deposition.

Figure 1C:
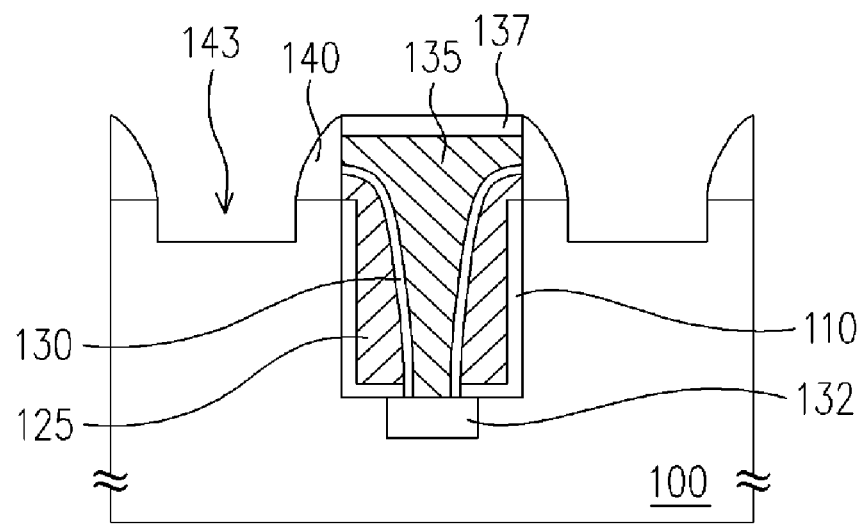

Then, referring to FIG. 1C, the mask layer 103 and the pad layer 101 are removed, and the removing method includes wet etching or dry etching. Thereafter, a spacer material layer (not shown) is formed on the substrate 100. The material of the spacer material layer includes, for example, silicon nitride, silicon carbide, or silicon oxycarbide, and the formation method thereof includes, for example, chemical vapor deposition. Then, part of the spacer material layer is removed, and a spacer 140 is formed on the sidewalls of the floating gate 125 and the source conductive layer 135. The method of removing part of the spacer material layer is, for example, by performing a dry etching method. Thereafter, part of the substrate 100 is removed using the spacer 140 as the mask so as to form the step-like recess 143 in the substrate 100. The method of removing part of the substrate 100 is, for example, a reactive ion etching method. Of course, the spacer 140 can also be formed using the method of removing part of the mask layer 103. Accordingly, it is not necessary to form the spacer material layer additionally.

Figure 1D:
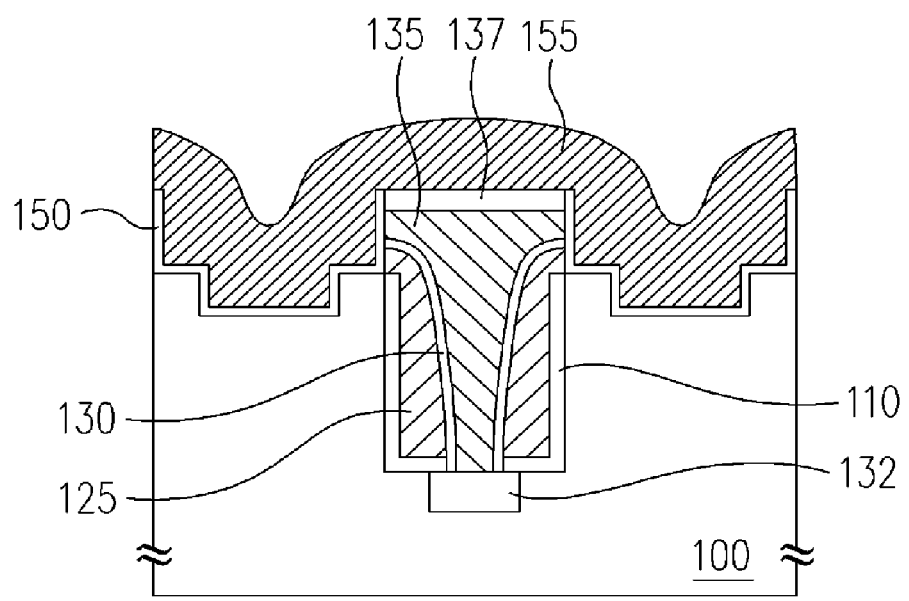

Next, referring to FIG. 1D, the spacer 140 is removed, and the removing method includes, for example, dry etching or wet etching. Thereafter, a control gate dielectric layer 150 is formed on the substrate 100. The material of the control gate dielectric layer 150 is, for example, silicon oxide, and the formation method of the control gate dielectric layer 150 includes, for example, a thermal oxidation method or chemical vapor deposition. Next, a conformal conductive layer 155 is formed on the substrate 100 so as to cover the control gate dielectric layer 150 and the protection layer 137. The material of the conductive layer 155 is, for example, doped polysilicon, and the formation method of doped polysilicon includes, for example, performing an ion implanting process after an undoped polysilicon layer is formed using chemical vapor deposition, or the doped polysilicon can also be formed by chemical vapor deposition using in-situ impurity implanting mode. Certainly, the material of the conductive layer 155 can also be the conductive material such as metal, metal silicide, etc., and the formation method thereof includes, for example, chemical vapor deposition or physical vapor deposition.

Figure 1E:
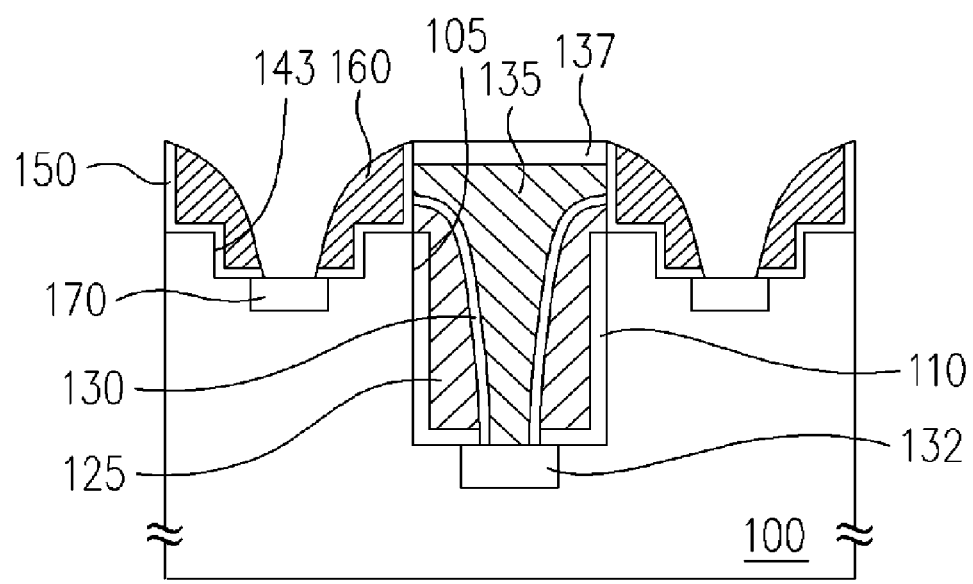

Next, referring to FIG. 1E, part of the conductive layer 155 is removed so as to form a control gate 160, and the control gate 160 is disposed on the sidewalls of the floating gate 125 and the source conductive layer 135 which extends in the step-like recess 143. The method of removing part of the conductive layer 155 is, for example, by means of dry etching. Next, a drain region 170 is formed in the substrate 100 at the bottom of the step-like recess 143. The drain region 170 is, for example, a P type doped region or an N type doped region, and the formation method thereof is performing impurity implanting for the exposed substrate 100 using the control gate 160 as the mask. A bit line (not shown) electrically connected to the drain region 170 can be further formed after the drain region 170 is formed. It is well known for those skilled in the art for the successive processes to complete the non-volatile memory, so that the detail is omitted here.

According to the embodiment of the present invention, as the step-like recess 143 is formed in the substrate 100, the channel region under the control gate 160 can thus become a step-like channel region. The length of the channel can be extended by forming the step-like channel region to avoid the leakage current. When the memory performs the programming and erasing operations, it would not generate program disturbance, and further, the reliability of the memory can be improved.

Moreover, the length of the step-like channel region under the control gate 160 can be changed through controlling the depth of the step-like recess 143, so that it is more flexible for the design configuration of the memory unit, which is more accordant to the current trend of device integration.

Furthermore, as the present invention applies self-alignment method to form the floating gate 125 and the control gate 160, but not uses a common photolithography technology. Not only the process window can be increased, but also the manufacturing cost and time can be saved.

The aforementioned embodiment describes the manufacturing method of non-volatile memory provided by the present invention. The following will describe the structure of the non-volatile memory provided by the present invention.

Referring to FIG. 1E, which is a schematic cross-sectional diagram of a non-volatile memory according to one embodiment of the present invention. The non-volatile memory includes a substrate 100, a floating gate 125, a control gate 160, a source region 132 and a drain region 170. Wherein, the substrate 100 is, for example, a silicon substrate. The trench 105 is disposed in the substrate 100, and a step-like recess 143 is located in the substrate 100 beside the trench 105.

The floating gate 125 is disposed on the sidewall of the trench 105, and the material thereof is, for example, conductive material such as doped polysilicon, metal or metal silicide. The control gate 160 is, for example, disposed on the substrate 100 between the trench 105 and the step-like recess 143, which extends in the step-like recess 143. As one part of the control gate 160 is disposed on the substrate 100 between the trench 105 and the step-like recess 143, and another part extends to the step-like recess 143; hence, the bottom of the control gate 160 is a step-like form along the substrate 100 and the surface of part of the step-like recess 143. That is, the channel region under the control gate 160 is step-like. The material of the control gate 160 on the substrate 100 includes, for example, conductive material such as doped polysilicon, metal or metal silicide.

A tunneling dielectric layer 110 is, for example, disposed between the floating gate 125 and the substrate 100, and the material of the tunneling dielectric layer 110 is, for example, silicon oxide. A control gate dielectric layer 150 is disposed between the control gate 160 and the floating gate 125, and between the control gate 160 and the substrate 100, and the material of the control gate dielectric layer 150 is, for example, silicon oxide.

The source region 132 is disposed in the substrate 100 at the bottom of the trench 105, and the source region 132 is, for example, a P type doped region or an N type doped region. The drain region 170 is disposed in the substrate 100 at the bottom of the step-like recess 143, and the drain region is, for example, the P type doped region or N type doped region with the same conductive type as the source region. A bit line (not shown) electrically connected to the drain region 170 is, for example, disposed on the drain region 170.

A source conductive layer 135 is, for example, disposed on the source region 132 and between the floating gates 125 so as to fill the gap between the floating gates 125. And, the top surface of the source conductive layer 135 is higher than the top of the floating gate 125. The material of the source conductive layer 135 is, for example, conductive material such as doped polysilicon, metal, or metal silicide, etc. A floating gate dielectric layer 130 is, for example, disposed between the source conductive layer 135 and two sides of the floating gate 125 thereof. The material of the floating gate dielectric layer 130 includes, for example, silicon oxide, silicon nitride, silicon oxynitride or the dielectric material with at least two layers, such as silicon oxide-silicon nitride, silicon oxide-silicon nitride-silicon oxide, etc. A protection layer 137 is, for example, disposed on the source conductive layer 135, and the material of the protection layer 137 is, for example, silicon oxide.

In the aforementioned non-volatile memory, a step-like recess 143 is disposed beside the trench 105, and the control gate 160 is disposed on the substrate 100 between the trench 105 and the step-like recess 143 which extends in the step-like recess 143, so that the channel region under the control gate 160 is a step-like channel region. Therefore, the length of the channel region can still be increased without increasing the width size of the memory unit or even the width size of the memory unit is shortened. Accordingly, the leakage current can be avoided, and the program disturbance can also be avoided when the memory performing programming and erasing operations, and further, the reliability of the memory can be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-volatile memory, comprising:
    a substrate, wherein a trench is disposed in the substrate, and a step-like recess is located in the substrate beside the trench;
    a floating gate, disposed on the sidewall of the trench;
    a control gate, disposed on the substrate between the trench and the step-like recess and extending in the step-like recess;
    a source region, disposed in the substrate at the bottom of the trench;
    a drain region, disposed in the substrate at the bottom of the step-like recess; and
    a step-like channel region, disposed under the control gate.

2. The non-volatile memory as claimed in claim 1, wherein the top of the floating gate is higher than the top surface of the substrate.

3. The non-volatile memory as claimed in claim 1, further comprising a tunneling dielectric layer, disposed between the floating gate and the substrate.

4. The non-volatile memory as claimed in claim 1, further comprising a floating gate dielectric layer, disposed on the surface of the floating gate.

5. The non-volatile memory as claimed in claim 4, wherein the material of the floating gate dielectric layer comprises silicon oxide-silicon nitride-silicon oxide.

6. The non-volatile memory as claimed in claim 1, further comprising a control gate dielectric layer, disposed between the control gate and the floating gate, and between the control gate and the substrate.

7. The non-volatile memory as claimed in claim 1, further comprising a source conductive layer, disposed on the source region so as to fill the trench.

8. The non-volatile memory as claimed in claim 7, further comprising a protection layer, disposed on the source conductive layer.

9. The non-volatile memory as claimed in claim 1, further comprising a bit line, electrically connected to the drain region.

10. The non-volatile memory as claimed in claim 1, wherein the material of the control gate comprises doped polysilicon.

11. A manufacturing method of a non-volatile memory, comprising:
    providing a substrate;
    forming a mask layer on the substrate;
    forming a trench in the substrate and the mask layer;
    forming a tunneling dielectric layer in the trench;
    forming a floating gate on the sidewall of the trench;
    forming a floating gate dielectric layer on the floating gate;
    forming a source region in the substrate under the trench;
    removing part of the mask layer and forming a first spacer on the substrate at the outside of the trench;
    etching the substrate which is not covered by the first spacer so as to form the step-like recess in the substrate;
    removing the first spacer;
    forming a control gate dielectric layer on the substrate;
    forming a control gate on the substrate and the control gate extending in the step-like recess from the outside of the trench, wherein a channel region under the control gate is step-like; and
    forming a drain region in the substrate at the bottom of the step-like recess.

12. The manufacturing method of the non-volatile memory as claimed in claim 11, wherein the formation method of the control gate comprises:
    forming a conductive layer on the substrate; and
    removing pan of the conductive layer so as to form the control gate and part of the substrate at the bottom of the step-like recess is exposed.

13. The manufacturing method of the non-volatile memory as claimed in claim 11, wherein the formation method of the floating gate comprises:
    forming a conductive layer on the substrate, wherein the top surface of the conductive layer is higher than the top surface of the substrate;
    forming a second spacer on the two sidewalls of the trench on the conductive layer;
    removing part of the conductive layer using the second spacer as the mask so as to form the floating gate on the two sidewalls of the trench and expose part of the substrate at the bottom of the trench; and
    removing the second spacer.

14. The manufacturing method of the non-volatile memory as claimed in claim 11, wherein the formation method of the first spacer further comprises:
    removing the mask layer;
    forming a first spacer material layer on the substrate; and
    removing part of the first spacer material layer, and forming the first spacer on the sidewall of the floating gate.

15. The manufacturing method of the non-volatile memory as claimed in claim 11, further comprising forming a source conductive layer in the trench after the step of forming the floating gate dielectric layer.

16. The manufacturing method of the non-volatile memory as claimed in claim 15, further comprising forming a protection layer on the source conductive layer after the step of forming the source conductive layer.

17. The manufacturing method of the non-volatile memory as claimed in claim 11, wherein the material of the floating gate dielectric layer comprises silicon oxide-silicon nitride-silicon oxide.

18. The manufacturing method of the non-volatile memory as claimed in claim 11, wherein the material of the control gate comprises doped polysilicon.

19. The manufacturing method of the non-volatile memory as claimed in claim 11, further comprising forming a bit line, electrically connected to the drain region after the step of forming the drain region.

* * * * *